(12) United States Patent
Chittipeddi et al.

(10) Patent No.: US 6,387,772 B1
(45) Date of Patent: May 14, 2002

(54) METHOD FOR FORMING TRENCH CAPACITORS IN SOI SUBSTRATES

(75) Inventors: Sailesh Chittipeddi, Allentown; Charles Walter Pearce, Emmaus, both of PA (US); Pradip Kumar Roy, Orlando, FL (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/557,536

(22) Filed: Apr. 25, 2000

(51) Int. Cl.[7] .............................................. H01L 21/20
(52) U.S. Cl. ........................................ 438/386; 438/243
(58) Field of Search ................................. 438/243, 245, 438/248, 386, 388, 391

(56) References Cited

U.S. PATENT DOCUMENTS 5,276,338 A * 1/1994 Beyer et al.
5,442,584 A * 8/1995 Jeong et al.
5,466,625 A * 11/1995 Hsieh et al.
5,759,907 A * 6/1998 Assaderaghi et al. ....... 438/386

* cited by examiner

Primary Examiner—Tuan H. Nguyen
(74) Attorney, Agent, or Firm—Christie, Parker & Hale, LLP

(57) ABSTRACT

A trench capacitor formed on an SOI substrate extends through an upper silicon layer and an insulating layer and into a semiconductor base substrate. The outer electrode of the trench capacitor includes portions of the semiconductor base substrate which bound the trench in which the trench capacitor is formed. The outer electrode is coupled to a contact structure formed in close proximity to the trench capacitor, and which extends through the insulating layer. The method for simultaneously producing the trench capacitor and contact structure includes forming two trench openings, forming a dielectric liner on one of the trench openings, then filling each of the trench openings with a semiconductor material.

11 Claims, 3 Drawing Sheets

METHOD FOR FORMING TRENCH CAPACITORS IN SOI SUBSTRATES

TECHNICAL FIELD

The present invention relates, most generally, to semiconductor devices and methods for forming the same. More particularly, the present invention relates to trench capacitors formed on silicon-on-insulator substrates.

BACKGROUND OF THE INVENTION

Semiconductor devices typically utilize a multiplicity of capacitors to perform various charge storage functions. Capacitors include two electrodes isolated from each other by an insulating material referred to as a dielectric. Electrodes are commonly formed of conductive or semiconductive materials. According to conventional semiconductor manufacturing methods, capacitors are "vertically stacked" and include a horizontally formed dielectric material which insulates conductive or semiconductive materials formed above and below the is dielectric. Materials used as conductive materials include various metals, and materials used as semiconductive materials include doped polysilicon and other films, as well as the silicon substrate itself. The ability of a capacitor to store charge depends on the capacitor area. Since conventional stacked capacitors are formed above the surface of the semiconductor substrate, as the area of the capacitor increases to enhance the charge storage ability of the capacitor, it does so at the expense of substrate surface area which might otherwise be used for other device features. As a result and in order to minimize the surface area occupied by capacitors, trench capacitors have become highly favored in the semiconductor manufacturing industry.

Trench capacitors extend down from the surface of the semiconductor substrate and include a capacitor area which increases as does the depth and width of the trench opening in which the trench capacitor is formed. It can be therefore understood that the charge-storage ability of the capacitor can be increased by simply increasing the depth of the trench and not at the expense of substrate surface area. Trench capacitors are therefore highly favored.

Recent trends in the semiconductor manufacturing industry have been towards the use of silicon-on-insulator (SOI) substrates. SOI substrates are favored because active devices formed within the upper silicon layer, are insulated from the bulk substrate. Therefore, device leakage through the substrate is minimized and other problems associated with being electrically coupled to the substrate, are avoided. The use of SOI technology, however, presents a problem since the trench openings commonly used to form trench capacitors, must extend through the insulating layer of the silicon-on-insulator substrate in order for the trench capacitor to have a sufficient capacitor area. The problem results because the outer of the trench capacitor electrodes is the substrate region which bounds the trench opening. The trench opening is filled with a dielectric liner which insulates the other electrode, commonly a plug formed of a semiconductor material disposed within the trench, from the outer electrode. A shortcoming associated with the use of trench capacitors in SOI technology is that the outer capacitor electrode is insulated from the substrate surface by the insulator film of the silicon-on-insulator substrate structure and cannot be easily contacted. An alternative approach for integrating capacitors into SOI technology would be to revert to stacked capacitors formed above the substrate surface and which include a capacitor area which comes at the expense of device geometry. In these days of advancing device integration, this particular approach is not favored.

The present invention addresses these issues and provides a space saving trench capacitor which is compatible with SOI technology.

SUMMARY OF THE INVENTION

The present invention provides a method for forming a semiconductor device including a trench capacitor compatible with SOI technology. The trench capacitor extends through the upper silicon layer and the insulating layer, and extends into the semiconductor base substrate beneath the insulating layer. The trench capacitor includes an inner electrode formed within the trench opening and surrounded by a capacitor dielectric material. The trench capacitor also includes an outer electrode which is electrically coupled to a contact structure formed in close proximity to the trench capacitor. The outer electrode may include portions of the base semiconductor substrate which bound the trench opening, portions of the silicon layer which bound the trench opening, or both.

The method includes forming an associated contact structure in close proximity to the trench capacitor by providing a silicon-on-insulator substrate including a silicon layer formed over an insulating layer formed over a base substrate, forming a duality of trench openings that extend into the base substrate, thermally oxidizing to selectively form an oxide liner on one of the trench openings, and filling each trench opening with a semiconductor material. The contact structure includes a semiconductor material formed in a trench which extends through the insulator material and is thereby electrically coupled to the outer trench electrode which includes portions of the base semiconductor substrate which bound the trench capacitor.

It is to be understood that both the foregoing general description and the following detailed description are exemplary, but not restrictive of the invention.

BRIEF DESCRIPTION OF THE DRAWING

The invention is best understood from the following detailed description when read in connection with the accompanying drawing. It is emphasized that, according to common practice, the various features of the drawing are not to-scale. On the contrary, the dimensions of the various features are arbitrarily expanded or reduced for clarity. Included in the drawing are the following figures:

FIG. 1 is a cross-sectional view showing two trench openings formed within an SOI substrate;

FIG. 2 is a cross-sectional view showing a masking pattern formed over an oxidation resistant film formed over the structure shown in FIG. 1;

FIG. 3 is a cross-sectional view showing the structure from FIG. 2 is after the oxidation resistant film has been removed;

FIG. 4 is a cross-sectional view showing an oxide liner formed within one of the trench openings;

FIG. 5 is a cross-sectional view showing a trench capacitor and a contact structure; and FIG. 6 is a cross-sectional view showing the structure shown in FIG. 5 after openings for electrical contacts have been provided.

FIG. 7 shows a trench opening formed within an SOI substrate;

FIG. 8 shows a trench capacitor formed in the trench opening shown in FIG. 7; and FIG. 9 shows the trench capacitor shown in FIG. 8 after openings for electrical contacts have been provided.

DETAILED DESCRIPTION OF THE INVENTION

The present invention integrates a trench capacitor into SOI (silicon-on-insulator) processing technology. SOI processing technology utilizes any of various silicon-on-insulator substrates which are commercially available throughout the semiconductor manufacturing industry. Alternatively, the SOI substrate may be custom made to conform to specific device requirements. As such, the specific details of the silicon layer and the insulating layer used may vary significantly according to different embodiments. The present invention is not intended to be limited to any of the various SOI substrate embodiments available.

Figure 1:
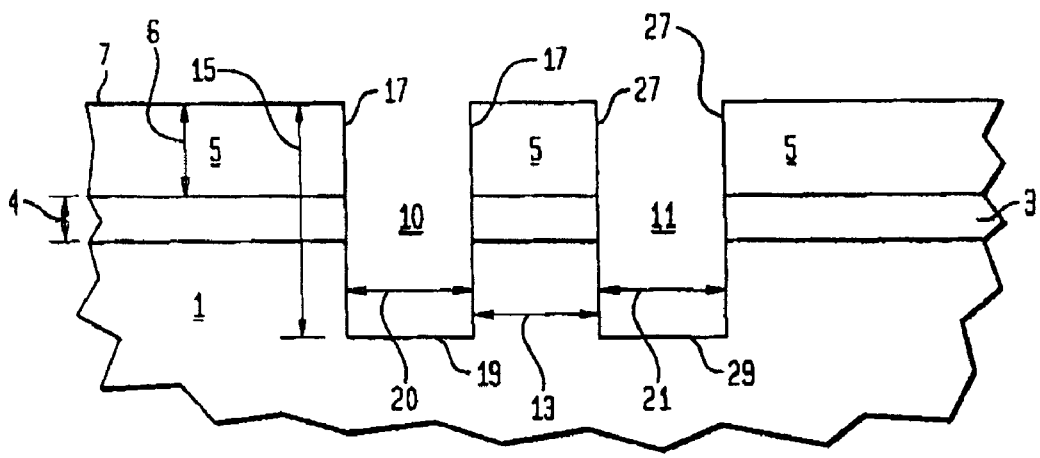
FIGS. 1–6 show a process sequence used to form a trench capacitor and contact structure according to a first exemplary embodiment.

Referring now to the drawing, in which like reference numbers refer to like elements throughout, FIGS. 1–6 show a process sequence used to form a first exemplary embodiment of the present invention. FIG. 1 shows two trench openings formed within an SOI substrate. SOI substrate includes semiconductor base substrate 1, insulating layer 3, and silicon layer 5. Semiconductor base substrate 1 may be a silicon wafer as commonly used in the semiconductor manufacturing industry. Other substrates may be used alternatively. Insulating layer 3 may be a silicon dioxide, or "oxide", film as commonly provided in the semiconductor manufacturing industry. Other insulating films may be used alternatively. Silicon layer 5 may be an amorphous silicon layer or it may be a polycrystalline silicon layer. As above, various SOI structures available in the art may be used as the substrate within which the trench capacitors of the present invention are formed. Thickness 6 of silicon layer 5 and thickness 4 of insulating layer 3 may vary according to the various SOI substrate structures available in the art. In an exemplary embodiment, thickness 4 may range from 200 angstroms to 6,000 angstroms. Thickness 6 may range from 500 angstroms to 3–4 microns. Regardless of the thicknesses, 6 and 4, of the respective silicon 5 and insulating 3 layers used, trench openings 10 and 11 which are formed to extend down from top surface 7 of silicon layer 5, will include depth 15 which exceeds the combination of thicknesses 4 and 6. In other words, trench opening 10 extends through silicon layer 5, through insulating layer 3, and extends into semiconductor base substrate 1. Trench is openings 10 and 11 may be formed simultaneously using conventional methods to form a masking pattern over top surface 7 of the SOI substrate, then etching through silicon layer 5 and insulating layer 3, and into semiconductor base substrate 1. In an exemplary embodiment, reactive ion itching may be used to sequentially etch the films and the semiconductor substrate.

Figure 5:
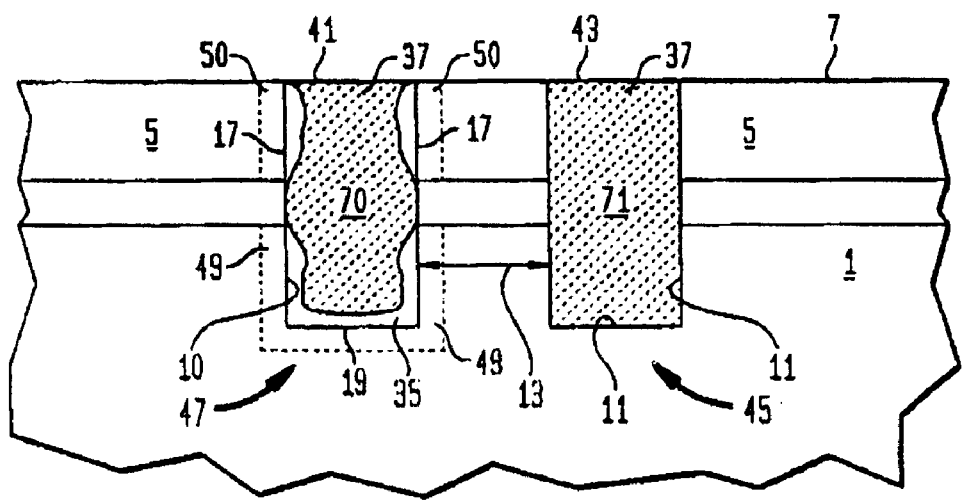

Trench opening 10 which will include the trench capacitor as will be shown in FIG. 5, includes width 20, depth 15, bottom surface 19, and sidewalls 17. Width 20 may vary from 0.1 microns to 2–3 microns. Depth 15 may vary from 0.5 to 6 microns. The aspect ratio of the trench opening 10 is defined as the ratio of depth 15 to width 20, and in the preferred embodiment will be less than or equal to 6.

When formed simultaneously along with trench opening 10, trench opening 11 will be formed to depth 15 and include bottom surface 29 and sidewalls 27. When an identical opening in the masking pattern (not shown) is used, trench opening 11 may also include width 21 which is substantially equal to width 20 of trench opening 10 . It should be understood, however, that trench opening 11, in which a contact structure will be formed as shown in FIG. 5, may be formed before or after trench opening 10. Trench opening 11 may also be formed from an opening in a masking pattern (not shown) having different dimensions than the opening used to form trench opening 10. As such, it can be seen that trench opening 11 is not intended to be limited to having the same depth 15 as trench opening 10, and width 21 may be less than or greater than width 20 of trench opening 10. Trench opening 101 will be used as a contact structure as will be seen in FIGS. 5 and 6 and will extend through silicon layer 5, through insulating layer 3, and into semiconductor base substrate 1. For simplicity, trench openings 10 and 11 are shown having substantially the same dimensions.

Trench opening 10 will be used to form a trench capacitor and trench opening 11 will be used to form a contact structure for contacting the trench capacitor. These structures will be shown in FIG. 5.

Figure 2:
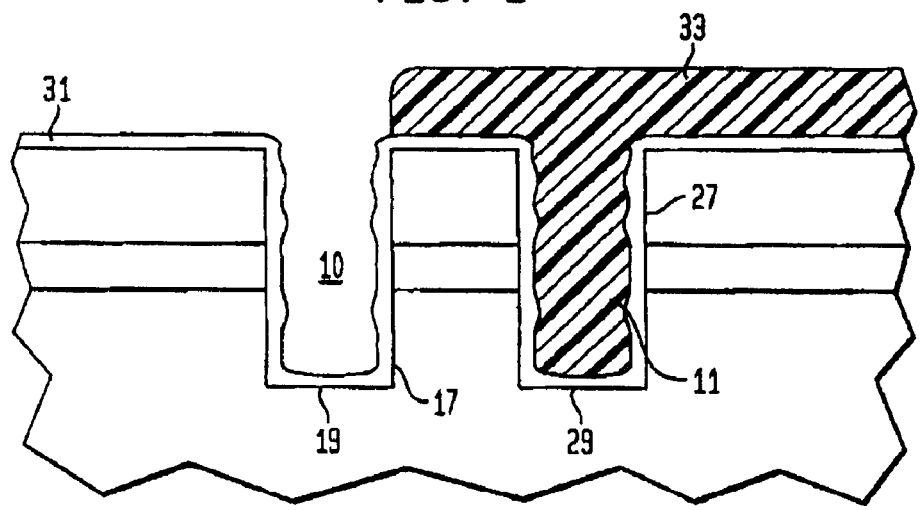

Now turning to FIG. 2, oxide resistant film 31 is formed over top surface 7 and within trench openings 10 and 11. As such, oxide resistant film 31 covers bottom surfaces 19 and 29 and sidewalls 17 and 27 of trench openings 10 and 11 respectively. Oxide resistant film 31 may be a conventionally formed film such as silicon nitride, titanium nitride, tungsten nitride, or tantalum nitride. Other oxide resistant films may be used alteatively. According to an exemplary embodiment, oxide resistant film 31 may include a thickness ranging from 50 angstroms to 5000 angstroms, and in a preferred embodiment will include a thickness ranging from 300 to 600 angstroms. According to an exemplary embodiment, prior to the formation of oxide resistant film 31, a seed layer (not shown) may be formed over the exposed surfaces. In an exemplary embodiment, the seed layer may be titanium or tantalum. Also shown in FIG. 2 is a pattern formed by masking film 33. The pattern is formed sequentially after the formation of oxide resistant film 31. In the preferred embodiment, masking film 33 may be a photoresist material. Any of various photoresist materials commonly available in the art, may be used. Other masking films may be used alternatively. The pattern formed in masking film 33 may be formed using conventional methods. It can be seen that masking film 33 does not cover trench opening 10 or some portions of top surface 7.

Figure 3:
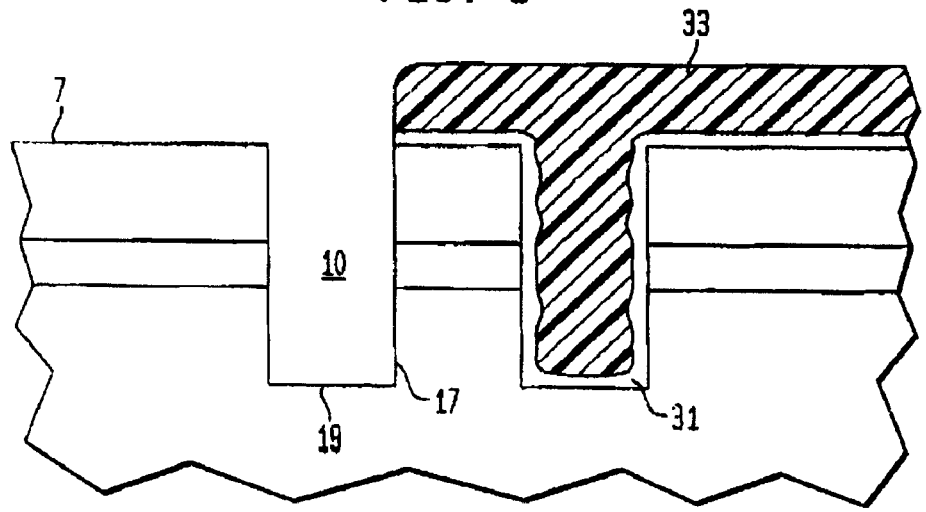

FIG. 3 shows the structure from FIG. 2 after an etching process has been used to remove oxide resistant film 31 from sidewalls 17 and bottom surface 19 of trench opening 10. Conventional etching methods may be used to remove portions of oxidation resistant film 31 which are exposed and not covered by masking film 33. After removal of oxide resistant film 31, it can be seen that original sidewalls 17 and bottom surface 19 of trench opening 10 are now exposed. After the structure shown in FIG. 3 has been formed, masking film 33 may be removed using conventional methods. After masking film 33 has been removed, a thermal oxide film is then formed on bottom surface 19 and sidewalls 17 of trench opening 10. The thermal oxide film may be formed using conventional thermal oxidation techniques and will be formed on exposed silicon surfaces not covered by oxidation resistant film 31. After the thermal oxide film is formed; oxidation resistant film 31 may be removed using conventional methods such as by exposure to phosphoric acid at a temperature greater than 160° C., but other suitable methods for removing oxidation resistant film 31, may be used alternatively.

Figure 4:
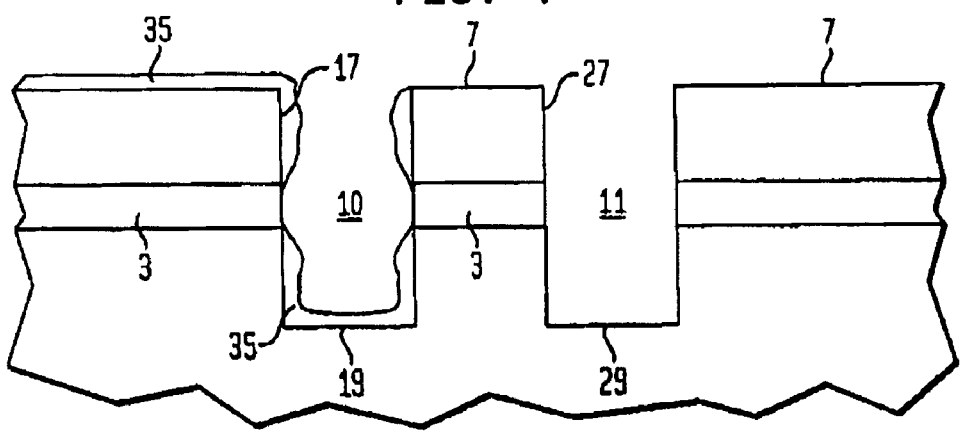

FIG. 4 shows the structure after the formation of thermal oxide film and the subsequent removal of oxidation resistant film 31 previously shown in FIG. 3. FIG. 4 shows thermal oxide film 35 formed over sidewalls 17 and bottom surface 19 of trench opening 10. Thermal oxide film 35 forms primarily on the exposed silicon sections of sidewalls 17 and bottom surface 19. Thermal oxide film 35 may include a thickness ranging from 50 to 100 angstroms according to an exemplary embodiment. This thickness is reduced or may be negligible at locations where sidewalls 17 are formed of insulating layer 3.

With thermal oxide film 35 intact and the oxidation resistant film removed, a semiconductor material is formed over top surface 7 of the SOI substrate, and filling each of trench openings 10 and 11 shown in FIG. 4. Conventional chemical vapor deposition techniques may be used to form a film of a semiconductor material over top surface 7 and filling trench openings 10 and 11. In the preferred embodiment, a polysilicon film may be used. According to alternative exemplary embodiments, amorphous silicon or other semiconductor materials may be used. According to various exemplary embodiments, the semiconductor film may be doped with any of various suitable dopant impurities. Conventional methods for doping the semiconductor film may be used. After the film is formed as described, the structure is polished, such as by chemical mechanical polishing, to remove portions of the semiconductor material from over the plane formed by top surface 7.

FIG. 5 shows the structure after the polishing technique has been carried out. After polishing, trench capacitor 47 formed in trench opening 10, includes upper surface 41 and contact structure 45 formed in contact opening 11 include s upper surface 43. It can be seen that upper surfaces 41 and 43 and top surface 7 form a substantially planar surface. It can be also seen that semiconductor material 37 is formed within each of trench opening 10 and trench opening 11. In the preferred embodiment, semiconductor material 37 may be doped polysilicon. In an alternative embodiment, other semiconductor materials may be used.

In yet another embodiment, not shown, trench opening 10 and trench opening 11 may be respectively filled with different materials. According to this embodiment, the films may be formed and polished separately. Other materials which may be used include other semiconductor materials or conductive materials such as aluminum which are commonly used in the semiconductor processing industry. It should be emphasized at this point that the invention is not intended to be limited to simultaneously filling trench openings 10 and 11 with a single material, then polishing the material.

Returning to FIG. 5, trench capacitor 47 includes plug 70 formed of semiconductor material 37 which is generally surrounded by thermal oxide film 35 which may have a minimal thickness at the junction of sidewall 17 and insulating layer 3. Plug 70 formed of semiconductor material 37 serves as an inner electrode of trench capacitor 47. Trench opening 11 is also filled with plug 71 of semiconductor material 37 to form contact structure 45. Contact structure 45 does not include an oxide liner. As such, plug 71 of semiconductor material 37 in contact structure 45 is electrically coupled to the semiconductor base substrate 1 and silicon layer 5.

Still referring to FIG. 5, trench capacitor 47 includes an outer electrode which is electrically insulated from the inner electrode formed by plug 70. The outer electrode may include regions 49 of semiconductor base substrate 1 which bound trench opening 10, it may include regions 50 of silicon layer 5 which bound trench opening 10, or it may comprise both, depending on where contact is made. In the exemplary embodiment shown, it can be seen that contact structure 45 is electrically coupled to each of silicon layer 5 including adjacent regions 50, and base semiconductor substrate 1 including adjacent regions 49. As such, if electrical contact is made to trench capacitor 47 by means of contact structure 45, the outer electrode of trench capacitor 47 will be comprised of each of regions 49 and 50. Trench capacitor 47 and contact structure 45 will be formed in close proximity to each other. Distance 13 by which trench capacitor 47 and contact structure 45 are spaced apart, may range from 1 to 5 microns according to various exemplary embodiments. Distance 13 will be chosen to ensure good electrical contact between contact structure 45 and the outer electrode of trench capacitor 47.

Figure 6:
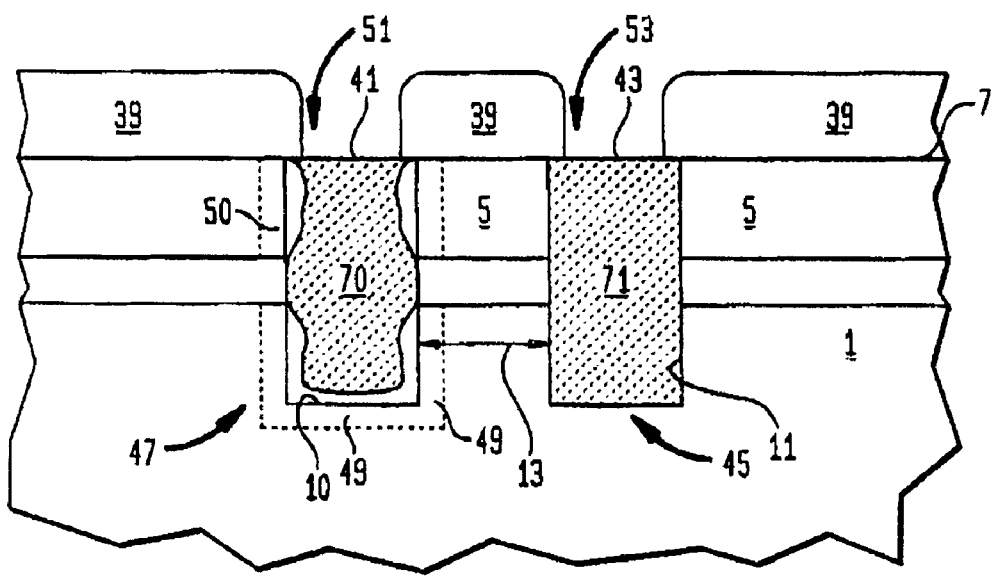

Now turning to FIG. 6, dielectric film 39 is formed over the structure, including over top surface 7 of silicon layer 5. Dielectric film 39 may be any suitable dielectric material such as silicon nitrides, silicon oxides, or silicon oxynitrides, and it may be formed using conventional methods, such as by chemical vapor deposition. After dielectric film 39 is formed, openings 51 and 53 may be formed through dielectric film 39 to provide contact to top surface 41 of trench capacitor 47 and top surface 43 of contact structure 45, respectively. Openings 51 and 53 may be formed using conventional patterning and etching techniques as commonly used in the art. After the openings are formed, separate electrical contact may be made to each of trench capacitor 47 and contact structure 45 through openings 51 and 53, respectively. Once electrical contact is made, it can be seen that the inner electrode of trench capacitor 47 (plug 70) may be contacted through opening 51, and the outer electrode of trench capacitor 47 which includes adjacent regions 50 of silicon layer 5 and adjacent regions 49 of semiconductor base substrate 1 may be contacted through opening 53 and contact structure 45 which is electrically coupled to both regions of the outer electrode.

It is to be emphasized, at this point, that an aspect of the present invention is a trench capacitor formed on an SOI substrate and having an outer electrode formed of the regions of the base substrate which bound the trench and which is disposed beneath the insulating layer of the SOI substrate. A further aspect of the present invention is the contact structure formed in close proximity to the trench capacitor, and which extends through the insulating layer of the SOI substrate. The contact structure is electrically coupled to the outer electrode. The foregoing description of the exemplary contact structure is not restrictive and contact structures of the present invention may be other sizes and configurations, they may be formed using different methods, and they may be formed of various other materials.

Figure 7:
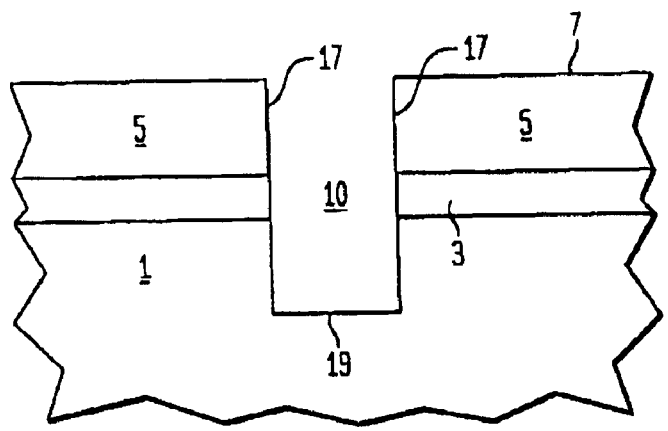
FIGS. 7–9 show a process sequence used to form a trench capacitor and contact structure according to a second exemplary embodiment.
Figure 8:
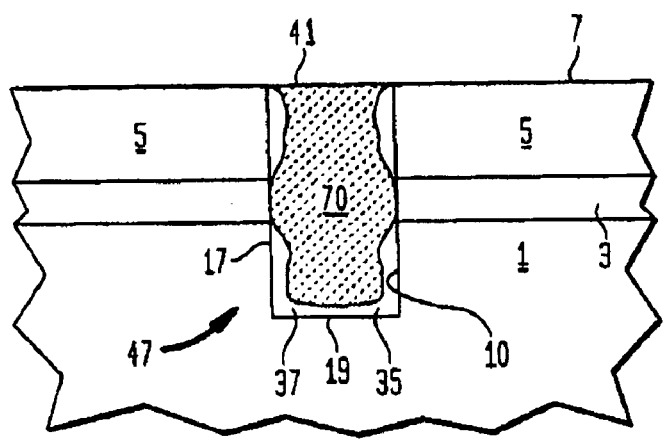
Figure 9:
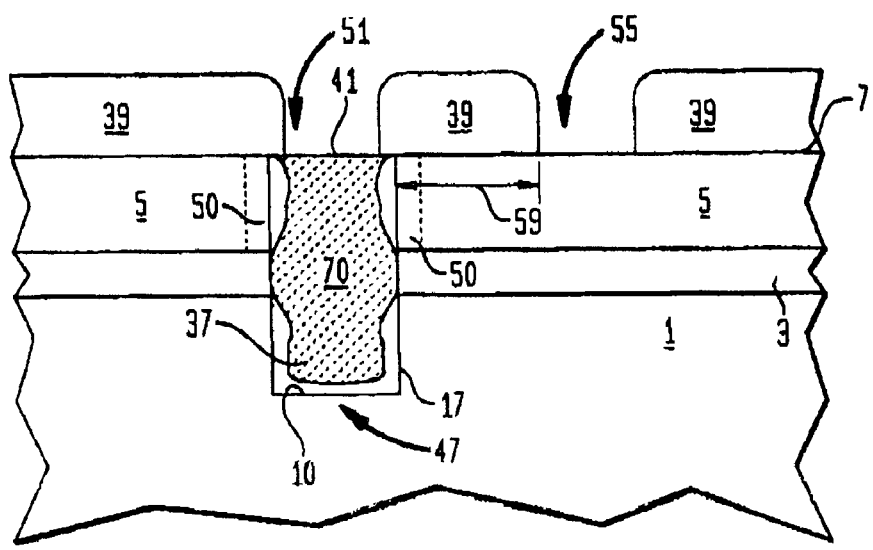

FIGS. 7–9 show a process sequence used according to a second exemplary embodiment for forming contact to a trench capacitor formed within an SOI substrate. This particular embodiment may be most desirable when silicon layer 5 is relatively thick. With reference to FIGS. 7–9, the reader is reminded that like reference numbers refer to like elements throughout the drawing.

FIG. 7 shows trench opening 10 formed within an SOI substrate as described in conjunction with FIG. 1, the exception being that a further trench structure is not formed in the immediate vicinity.

Turning to FIG. 8, trench capacitor 47 is formed as described in conjunction with the first exemplary embodiment. According to this second exemplary embodiment, after the trench capacitor 47 is formed as shown in FIG. 8, a dielectric film may be formed over top surface 7.

Now turning to FIG. 9, dielectric film 39 is formed over top surface 7. After dielectric film 39 is formed, two openings 51 and 55 are formed through dielectric film 39. Conventional methods for forming dielectric film 39 and for forming openings 51 and 55, may be used. Contact opening 51 is as shown and described in conjunction with FIG. 6, and makes contact to plug 70 of semiconductor material 37 which forms the inner electrode of trench capacitor 47. In addition, contact opening 55 is also formed through dielectric film 39. Contact opening 55 is placed in close proximity to the trench capacitor and is spaced by distance 59 from trench capacitor 47. In an exemplary embodiment, distance 59 may be a distance within the range of 1–5 microns. Contact opening 55 provides an opening for contacting silicon layer 5 but contact is not also made to semiconductor base substrate 1 which is insulated from silicon layer 5 by means of insulating layer 3. As such, the outer electrode of trench capacitor 47 includes only adjacent regions 50 of silicon layer 5 which bound trench opening 10 in which trench capacitor 47 is formed. As discussed in conjunction with FIG. 6, after openings 51 and 55 are formed, separate electrical contact may be made to the inner and outer electrodes of trench capacitor 47 through openings 51 and 55 respectively. It can be seen that when electrical contact is made through opening 55 to silicon layer 5, silicon layer 5 is electrically coupled to the outer electrode of trench capacitor 47.

It should be emphasized at this point that the present invention provides a trench capacitor which is compatible with SOI substrates and technology. The trench capacitor includes an inner electrode formed of a plug of a conductive or semiconductive material formed within a trench opening and surrounded by an insulating film. The trench capacitor also includes an outer electrode. The outer electrode may include adjacent portions of the silicon layer which bound the trench, it may include adjacent portions of the semiconductor base substrate which bound the trench, and it may include portions of both. The contact made to the functioning outer electrode may be made according to the first exemplary embodiment or the second exemplary embodiment or it may be made by providing another contact structure which is electrically coupled to the outer electrode of the trench capacitor. Various other structures for electrically coupling to the outer electrode are included in the present invention, which is not intended to be limited to the specific examples described.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A method for forming a semiconductor device, comprising the steps of:
    (a) providing a silicon-on-insulator substrate, said silicon-on-insulator substrate including a silicon layer formed over an insulating layer formed over a semiconductor base substrate;
    (b) forming a duality of trench openings extending through-said silicon layer and said insulating layer and extending into said semiconductor base substrate;
    (c) thermally oxidizing to selectively form an oxide liner directly on sidewalls and a bottom surface of a first trench opening of said duality of trench openings, but not the second trench opening of said duality of trench openings; and
    (d) filling each of said trench openings with a semiconductor material thereby forming a trench capacitor in said first trench opening and a contact structure in said second trench opening, said contact structure electrically coupled to said trench capacitor through said semiconductor base substrate.

2. The method as in claim 1, further comprising step (e) providing electrical contact to each of said trench capacitor and said contact structure.

3. The method as in claim 1, wherein said semiconductor material thereby forms a first electrode of said trench capacitor, and a second electrode of said trench capacitor comprises portions of said semiconductor base substrate which bound said trench opening.

4. The method as in claim 1, further comprising step (e) forming a dielectric film over said trench capacitor, said contact structure, and a top surface of said silicon layer, and step (f) forming a first contact opening through said dielectric film and exposing said semiconductor material of said trench capacitor and forming a second contact opening through said dielectric film and exposing said semiconductor material of said contact structure.

5. A method for forming a semiconductor device, comprising the steps of:
    (a) providing a silicon-on-insulator substrate, said silicon-on-insulator substrate including a silicon layer formed over an insulating layer formed over a semiconductor base substrate;
    (b) forming a duality of trench openings, each extending through said silicon layer and said insulating layer and extending into said semiconductor base substrate;
    (c) forming an oxidation resistant film on sidewalls and a bottom surface of a first of said duality of trench openings;
    (d) forming an oxide liner directly on sidewalls and a bottom surface of the second of said duality of trench openings;
    (e) removing said oxidation resistant film; and
    (f) filling each of said trench openings with a semiconductor material.

6. The method as in claim 5, in which said step (f) includes thereby forming a first electrode of a trench capacitor within said second of said duality of trench openings and wherein portions of said semiconductor base substrate which bound said second of said duality of trench openings, form a second electrode of said trench capacitor.

7. The method as in claim 6, in which said step (f) includes thereby forming a contact structure in said first of said duality of trench openings, said contact structure being electrically coupled to said second electrode.

8. The method as in claim 5, in which the step of forming an oxidation resistant film over sidewalls and a bottom surface of said first of said duality of trench openings comprises forming one of a silicon nitride film, a titanium nitride film, a tungsten nitride film, and a tantalum nitride film.

9. The method as in claim 5, in which said step (c) comprises the steps of:
  (i) forming said oxidation resistant film over a top surface of said silicon layer and over sidewalls and a bottom surface of each of said duality of trench openings; and
  (ii) removing said oxidation resistant film from said second of said duality of trench openings thereby forming remaining portions of said oxidation resistant film, and in which said step (e) comprises removing said remaining portions of said oxidation resistant film.

10. The method as in claim 5, wherein said step (f) comprises filling each of said duality of trench openings with polysilicon.

11. The method as in claim 5, wherein said step (f) comprises depositing said semiconductor material within each of said duality of trench openings and over a top surface of said silicon layer, then polishing using chemical mechanical polishing, thereby removing said semiconductor film from above a plane formed by said top surface, said semiconductor material remaining within each of said duality of trench openings.

* * * * *